United States Patent
Kobayashi et al.

(10) Patent No.: US 9,748,337 B2
(45) Date of Patent: Aug. 29, 2017

(54) SEMICONDUCTOR MEMORY DEVICE

(71) Applicant: Kabushiki Kaisha Toshiba, Minato-ku (JP)

(72) Inventors: Shigeki Kobayashi, Kuwana (JP); Mitsuru Sato, Yatomi (JP); Tomohiro Yamada, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 3 days.

(21) Appl. No.: 14/849,737

(22) Filed: Sep. 10, 2015

(65) Prior Publication Data

US 2016/0268268 A1 Sep. 15, 2016

Related U.S. Application Data

(60) Provisional application No. 62/132,129, filed on Mar. 12, 2015.

(51) Int. Cl.
*H01L 29/792* (2006.01)
*H01L 29/66* (2006.01)
*H01L 27/115* (2017.01)
*H01L 29/10* (2006.01)
*H01L 27/11582* (2017.01)

(Continued)

(52) U.S. Cl.
CPC .... *H01L 29/1037* (2013.01); *H01L 21/28282* (2013.01); *H01L 27/11582* (2013.01); *H01L 29/0676* (2013.01)

(58) Field of Classification Search
CPC ........... H01L 27/11582; H01L 27/1157; H01L 21/28282; H01L 27/11568; H01L 29/513; H01L 29/792; H01L 29/7926; H01L 27/11524; H01L 27/11565; H01L 29/7881; H01L 27/11556
USPC ................ 257/324, 752, 754, 758, E21.473, 257/E29.309
See application file for complete search history.

(56) References Cited

U.S. PATENT DOCUMENTS 8,203,884 B2 6/2012 Kito et al.
8,373,222 B2 2/2013 Sekine et al.
(Continued)

FOREIGN PATENT DOCUMENTS

JP 2011-66348 3/2011
JP 2013-105979 5/2013

*Primary Examiner* — Mary Wilczewski
*Assistant Examiner* — Tsz Chiu
(74) *Attorney, Agent, or Firm* — Oblon, McClelland, Maier & Neustadt, L.L.P.

(57) ABSTRACT

Three directions intersecting each other are referred to as first to third directions. A semiconductor memory device according to embodiments includes a semiconductor substrate having a top surface spread in the first and second directions, and a plurality of conductive layers laminated at predetermined intervals in the third direction on the semiconductor substrate. The semiconductor memory device further includes a columnar semiconductor layer having an interface that is in contact with the semiconductor substrate on a side surface. The columnar semiconductor layer is opposed to the plurality of conductive layers. The columnar semiconductor layer has the third direction as a lengthwise direction. The interface exists in a position deeper than the top surface of the semiconductor substrate in the third direction.

6 Claims, 10 Drawing Sheets

(51) Int. Cl.
*H01L 21/28* (2006.01)
*H01L 29/06* (2006.01)

(56) References Cited

U.S. PATENT DOCUMENTS

| | | | |
|---|---|---|---|
| 8,669,608 B2 * | 3/2014 | Sato | H01L 29/66833 257/324 |
| 8,847,303 B2 | 9/2014 | Kito et al. | |
| 2010/0207195 A1 * | 8/2010 | Fukuzumi | G11C 16/0483 257/326 |
| 2010/0244119 A1 * | 9/2010 | Fukuzumi | H01L 27/11578 257/324 |
| 2013/0075805 A1 * | 3/2013 | Sato | H01L 29/66833 257/324 |
| 2015/0371999 A1 * | 12/2015 | Kurusu | H01L 27/11551 257/314 |

* cited by examiner

SEMICONDUCTOR MEMORY DEVICE

CROSS-REFERENCE TO RELATED APPLICATIONS

This application is based upon and claims the benefit of priority from the prior U.S. Provisional Application 62/132,129, filed on Mar. 12, 2015, the entire contents of which are incorporated herein by reference.

BACKGROUND

Field

The present invention relates to a semiconductor memory device.

Description of the Related Art

As one kind of semiconductor memory devices, there is flash memory. In particular, the NAND-type flash memory is generally widely used because of the low cost and large capacity. Furthermore, up to now, a large number of techniques for further increasing the capacity of the NAND-type flash memory have been proposed. One of the proposed techniques is a structure in which memory cells are disposed in a three-dimensional manner.

DETAILED DESCRIPTION

Three directions intersecting each other are referred to as first to third directions. A semiconductor memory device according to embodiments includes a semiconductor substrate having a top surface spread in the first and second directions, and a plurality of conductive layers laminated at predetermined intervals in the third direction on the semiconductor substrate. The semiconductor memory device further includes a columnar semiconductor layer having an interface that is in contact with the semiconductor substrate on a side surface. The columnar semiconductor layer is opposed to the plurality of conductive layers. The columnar semiconductor layer has the third direction as a lengthwise direction. The interface exists in a position deeper than the top surface of the semiconductor substrate in the third direction.

Hereafter, semiconductor memory devices according to embodiments will be described with reference to the drawings.

First Embodiment

First, a general configuration of a semiconductor memory device according to a first embodiment will now be described.

Figure 1:
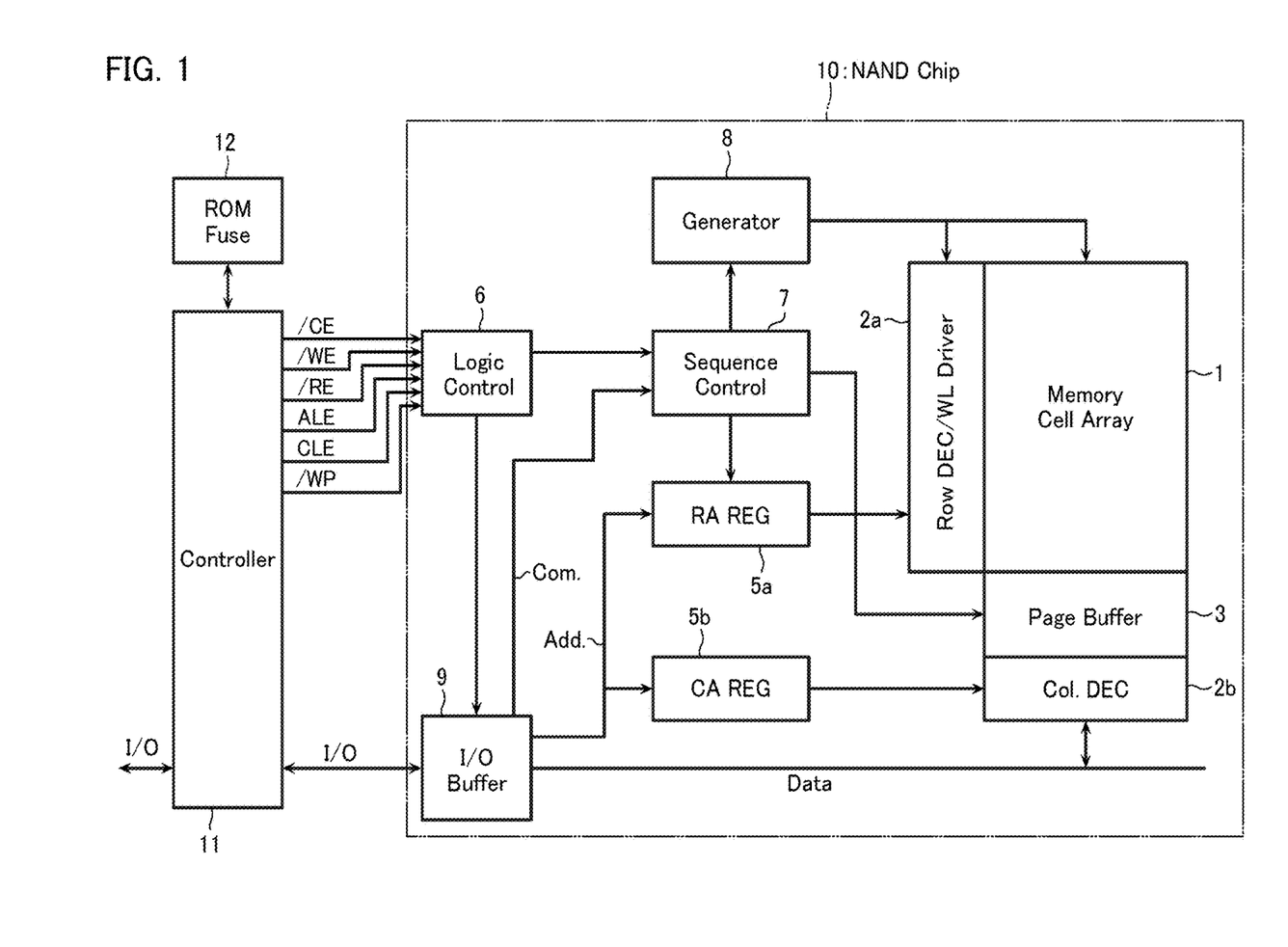
FIG. 1 is a diagram illustrating function blocks in a semiconductor memory device according to a first embodiment.

FIG. 1 is a diagram illustrating function blocks of a semiconductor memory device according to the present embodiment.

The semiconductor memory device is NAND-type flash memory. The semiconductor memory device includes a NAND chip 10, a controller 11 which controls the NAND chip 10, and a ROM fuse 12 which stores various kinds of information required to access the NAND chip 10.

The NAND chip 10 includes a memory cell array 1. The memory cell array 1 includes a plurality of bit lines, a plurality of word lines, a source line, and memory units each disposed between a bit line and the source line. Each memory unit includes a plurality of memory cells connected in series. Several memory cells share one word line and constitute a page. Data writing/reading in the flash memory is conducted by taking a page as the unit. The memory cell array 1 will be described in detail later.

Furthermore, the NAND chip 10 includes a control unit, which executes data writing into the memory cell, data erasing in the memory cell, and data reading from the memory cell. (Hereafter, the data writing, data erasing, and data reading are generally referred to as "memory operation" sometimes.) The control unit includes a row decoder/word line driver 2a, a column decoder 2b, a page buffer 3, a row address register 5a, a column address register 5b, a logic control circuit 6, a sequence control circuit 7, a voltage generator circuit 8, and an I/O buffer 9.

The row decoder/word line driver 2a drives the word line in the memory cell array 1 and a selection gate line described later. The page buffer 3 includes sense amplifier circuits and latch circuits corresponding to one page. Read data corresponding to one page retained by the page buffer 3 is sequentially subject to column selection conducted by the column decoder 2b, and output to an external I/O terminal via the I/O buffer 9. Write data supplied from the I/O terminal is selected by the column decoder 2b and loaded into the page buffer 3. Write data corresponding to one page is loaded into the page buffer 3. Row and column address signals are input via the I/O buffer 9, and transferred to the row decoder 2a and the column decoder 2b, respectively. The row address register 5a retains an erase block address in a case of data erase, and retains a page address in a case of data write/read. A top column address for loading write data before data write start or a top column address for data reading is input to the column address register 5b. The column address register 5b retains the input column address until a write enable signal/WE or a read enable signal/RE is toggled under a predetermined condition.

The logic control circuit 6 controls command and address input and data input and output on the basis of control signals such as a chip enable signal/CE, a command latch enable signal CLE, an address latch enable signal ALE, a write enable signal/WE, a read enable signal/RE, and a write protect signal/WP. The sequence control circuit 7 receives a command from the logic control circuit 6, and control the memory operation on the basis of the command. The voltage generator circuit 8 is controlled by the sequence control circuit 7 to generate predetermined voltages required for the memory operation.

The controller 11 controls the memory operation under a condition suitable for a current write state of the NAND chip 10. Note that, as for a portion of the control of the memory operation, the control unit in the NAND chip 10 may exercise control.

A structure of the memory cell array 1 in the present embodiment will now be described.

Figure 2:
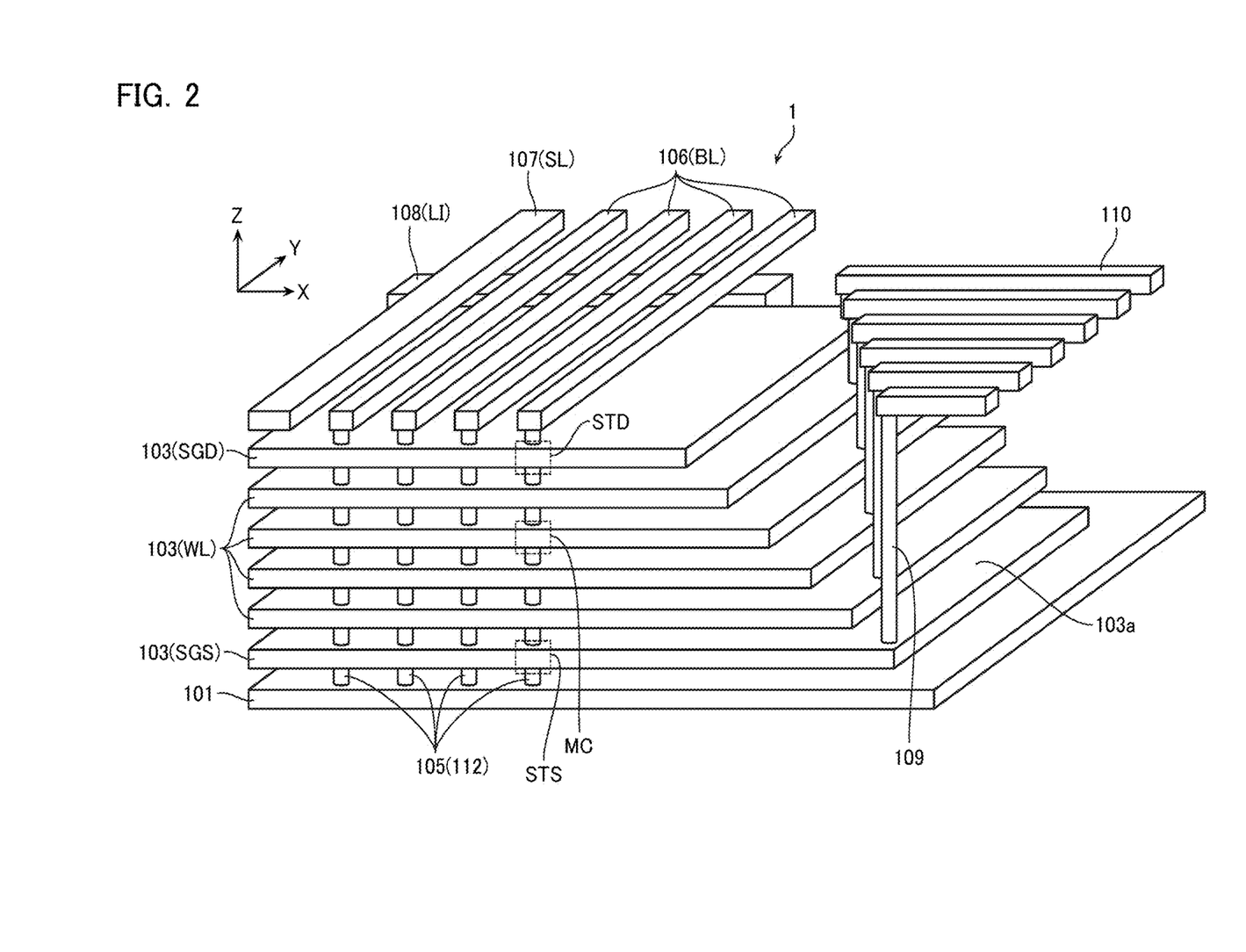
FIG. 2 is an oblique view illustrating a schematic structure of a memory cell array in the semiconductor memory device.

FIG. 2 is an oblique view illustrating a schematic structure of the memory cell array in the semiconductor memory device according to the present embodiment.

As illustrated in FIG. 2, the memory cell array 1 includes a semiconductor substrate 101, and a plurality of conductive layers 103 laminated at predetermined intervals in a Z direction on the semiconductor substrate 101.

The memory cell array 1 includes a plurality of memory columnar bodies 105 extending in the Z direction. Intersection portions between the conductive layers 103 and the memory columnar bodies 105 function as a source side selection transistor STS, a memory cell MC, or a drain side selection transistor STD. The conductive layer 103 is formed of, for example, tungsten (W), polysilicon (poly-Si) or the like. The conductive layer 103 functions as a source side selection gate line SGS, a word line WL, or a drain side selection gate line SGD.

The plurality of conductive layers 103 are formed in a staircase form. In other words, each of predetermined conductive layers 103 has a contact portion 103a which is not opposed to a bottom surface of another conductive layer 103 located as an upper layer. Furthermore, the conductive layer 103 is connected to a via 109 in the contact portion 103a. A wiring line 110 is disposed on a top end of the via 109. Note that, the via 109 and the wiring line 110 are formed of tungsten (W) or the like.

Furthermore, the memory cell array 1 includes a conductive layer 108, which is opposed to side surfaces of a plurality of conductive layers 103 in a Y direction and which extends in an X direction. A bottom surface of the conductive layer 108 is in contact with the semiconductor substrate 101. The conductive layer 108 is formed of, for example, tungsten (W). The conductive layer 108 functions as a source contact LI.

Furthermore, the memory cell array 1 includes a plurality of conductive lines 106 arranged in plurality in the X direction and extended in the Y direction, and a conductive line 107, located over the plurality of conductive layers 103 and memory columnar bodies 105. The memory columnar bodies 105 are connected electrically to bottom surfaces of the conductive lines 106, respectively. Note that, the conductive line 106 is formed of, for example, tungsten (W) or the like. The conductive line 106 functions as a bit line BL. The conductive layer 108 is connected electrically to a bottom surface of the conductive line 107. Note that, the conductive line 107 is formed of, for example, tungsten (W). The conductive line 107 functions as a source line SL.

A schematic structure of the columnar body 105 in the memory cell array 1 in the present embodiment will now be described.

Figure 3:
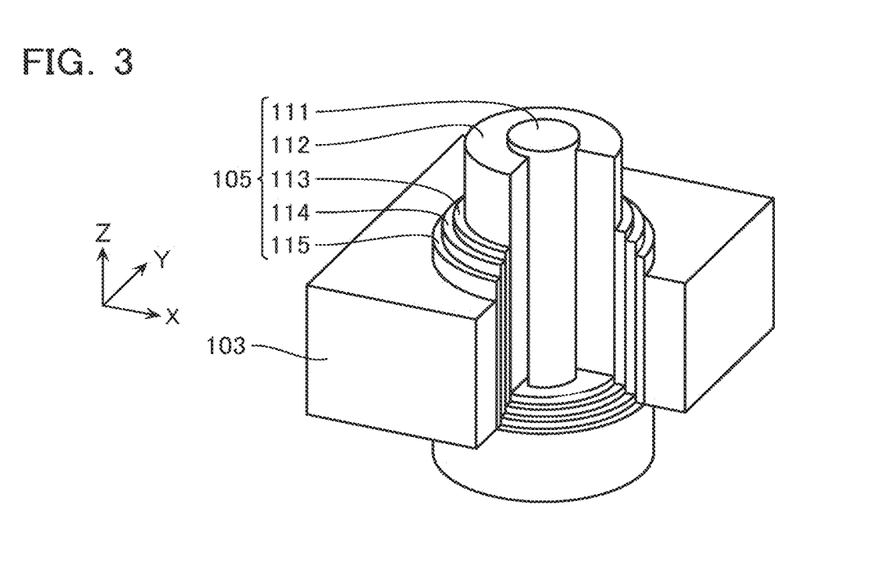
FIG. 3 is an oblique view illustrating a schematic structure of a columnar body in a memory cell in the semiconductor memory device.

FIG. 3 is an oblique view illustrating a schematic structure of the columnar body in the memory cell array in the semiconductor memory device according to the present embodiment. Note that, the source side selection transistor STS and the drain side selection transistor STD may also have a structure similar to the structure illustrated in FIG. 3.

As illustrated in FIG. 3, each columnar body 105 includes a columnar core 111 as an axis. The columnar body 105 includes a semiconductor layer 112, a tunnel insulation layer 113, a charge storage layer 114, and a block insulation layer 115, which are disposed to surround the periphery of the core 111. The core 111 may be formed of a material such as, for example, silicon oxide ($SiO_2$). The semiconductor layer 112 may be formed of a material such as, for example, silicon (Si), silicon germanium (SiGe), or silicon carbide (SiC). The tunnel insulation layer 113 may be formed of a material such as, for example, silicon oxide ($SiO_2$). The charge storage layer 114 may be formed of a material such as, for example, silicon nitride (SiN). The block insulation layer 115 may be formed of a material such as, for example, aluminum oxide ($Al_2O_3$) or yttrium oxide ($Y_2O_3$) besides silicon oxide ($SiO_2$). Note that, in the example illustrated in FIG. 3, the tunnel insulation layer 113, the charge storage layer 114, and the block insulation layer 115 are formed on the whole of a side surface of the semiconductor layer 112. However, forming positions of the tunnel insulation layer 113, the charge storage layer 114, and the block insulation layer 115 are not restricted to this example. The tunnel insulation layer 113, the charge storage layer 114, and the block insulation layer 115 may be formed only in a position of the word line WL in the Z direction. In the ensuing description, it is premised that the semiconductor layer 112 is made of poly-silicon (poly-Si).

According to the above-described structure of the columnar body 105, each of intersection portions between the columnar bodies 105 and the source side selection gate line SGS becomes the source side selection transistor STS having the source side selection gate line SGS as a control gate. Each of intersection portions between the columnar bodies 105 and the word line WL becomes the memory cell MC having the word line WL as a control gate. Respective memory cells MC store different data by increasing or decreasing the charge storage quantity in the charge storage layer 114. Each of intersection portions between the columnar bodies 105 and the drain side selection gate line SGD becomes the drain side selection transistor STD having the drain selection gate line SGD as a control gate.

Furthermore, the memory cell array 1 includes a source side selection gate line drive circuit 106, which drives the source side selection gate line SGS, and a word line drive circuit 108, which drives the word line WL via a leader line 107. The memory cell array 1 further includes and a drain side selection gate line drive circuit 110, which drives the drain side selection gate line SGD via a leader line 109.

Note that, a laminate body including an interlayer insulation layer 102 and conductive layers 103 and 104 in the memory cell array 1 is cut apart every block, which is a minimum unit of data erasing. A trench in which the insulation layer is buried is formed on a boundary of cutting apart.

An equivalent circuit of the memory unit MU in the present embodiment will now be described.

Figure 4:
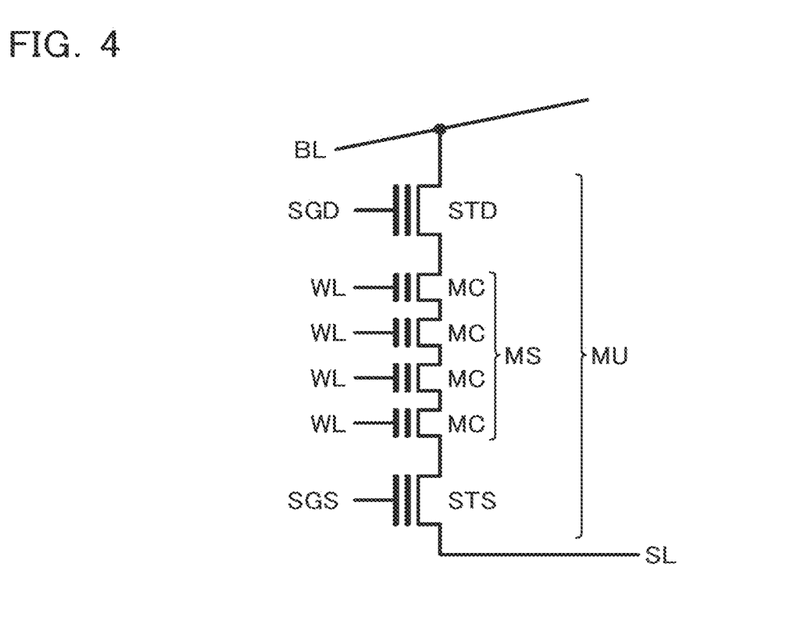
FIG. 4 is an equivalent circuit diagram of a memory unit in a memory cell array in the semiconductor memory device.

FIG. 4 is an equivalent circuit diagram of the memory unit in the memory cell array in the semiconductor memory device according to the present embodiment.

Each memory unit MU includes a memory string MS including a plurality of memory cells MC connected in series. Each memory unit MU further includes the source side selection transistor STS connected between a bottom end of the memory string MS and the source line SL, and the drain side selection transistor STD connected between a top end of the memory string MS and the bit line BL. A control gate of the source side selection transistor STS is connected to the source side selection gate line SGS. A control gate of each memory cell MC is connected to the word line WL. A control gate of the drain side selection transistor STD is connected to the drain side selection gate line SGD.

The connection portion between the semiconductor substrate 101 and the columnar body 105 will now be described.

The memory operation on the memory cell MC uses whether there is a cell current flowing through the memory unit MU. In other words, for implementing a secure memory operation, a sufficient cell current is needed. The cell current flows from the bit line BL side to the source line SL side via the semiconductor layer 112 in the columnar body 105 and the semiconductor substrate 101. For securing a sufficient cell current, therefore, it is necessary to lower the interface resistance (parasitic resistance) of the semiconductor substrate 101 and the semiconductor layer 112.

In the present embodiment, therefore, the connection portion between the semiconductor substrate 101 and the columnar body 105 has a structure described below.

Figure 5:
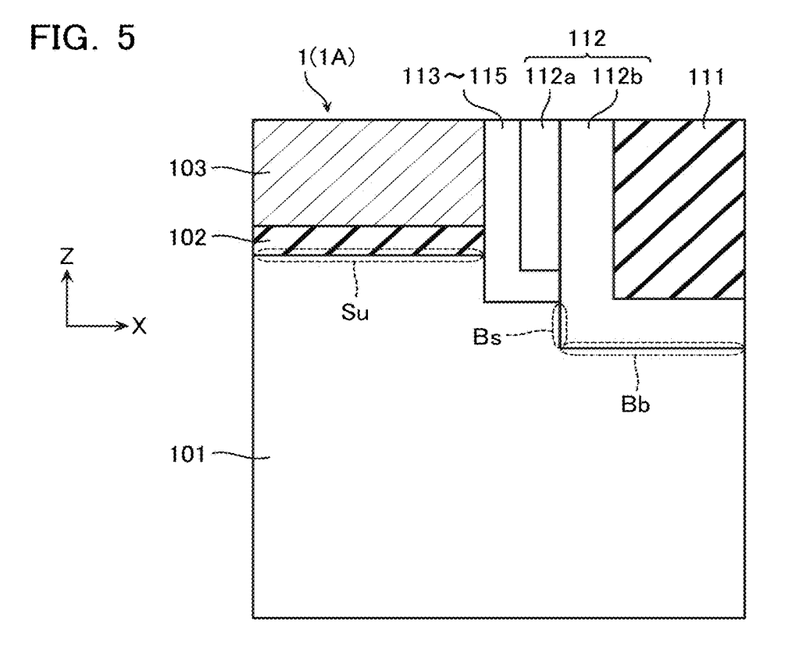
FIG. 5 is a schematic sectional view around a connection portion between a semiconductor substrate and the columnar body in the memory cell array in the semiconductor memory device.

FIG. 5 is a schematic sectional view around the connection portion between the semiconductor substrate and the columnar body in the memory cell array in the semiconductor memory device according to the present embodiment. Note that, in FIG. 5, the tunnel insulation layer 113, the charge storage layer 114, and the block insulation layer 115 are illustrated collectively for simplification.

In the structure illustrated in FIG. 5, the semiconductor layer 112 has a structure obtained by laminating a first semiconductor film 112a in contact with the block insulation layer 115 and a second semiconductor film 112b formed to cover a side surface and a bottom surface of the core 111. However, the semiconductor layer 112 is not restricted to this structure, but the semiconductor layer 112 may have one semiconductor film, or may have at least three semiconductor films.

In the case of the present embodiment, the columnar body 105 has a structure in which a portion of the columnar body 105 is buried in the semiconductor substrate 101. In addition, a bottom surface of the semiconductor layer 112 in the columnar body 105 is disposed in a position that is deeper than a bottom surface of the block insulation layer 115. As a result, the semiconductor layer 112 can have a contact surface with the semiconductor substrate 101 not only on the bottom surface but also on a portion of a side surface. Hereafter, in the contact surfaces between the semiconductor substrate 101 and the semiconductor layer 112, the portion of the bottom surface of the semiconductor layer 112 is referred to as "first interface" (Bb in FIG. 5) sometimes. A portion of a side surface of a bottom portion of the semiconductor layer 112 is referred to as "second interface" (Bs in FIG. 5) sometimes. Furthermore, a portion of the semiconductor layer 112 located in positions deeper than a top surface Su of the semiconductor substrate 101 is referred to as "bottom portion of semiconductor layer" sometimes.

Here, as a comparative example for the present embodiment, a case where the semiconductor layer is not buried in the semiconductor substrate and the position of the top surface of the semiconductor substrate and the position of the bottom surface of the semiconductor layer coincide with each other in the Z direction will be considered. In this case, the semiconductor layer has only the bottom surface thereof as an interface to the semiconductor substrate.

In the case of the present embodiment, the semiconductor layer 102 has the second interface Bs as well in addition to the first interface Bb as described above. As compared with the comparative example, therefore, in the present embodiment, the interface resistance between the semiconductor substrate 101 and the semiconductor layer 112 can be further reduced. As a result, it becomes possible to secure a sufficient cell current at the time of memory operation as compared with the comparative example, and more stable memory operation can be implemented.

Hereafter, several modifications of the memory cell array 1 in the first embodiment will be described. In the ensuing embodiments, the memory cell array in the first embodiment is denoted by character "1A" for convenience of description.

Second Embodiment

First, a structure of a memory cell array 1B in a semiconductor memory device according to a second embodiment will now be described.

Figure 6:
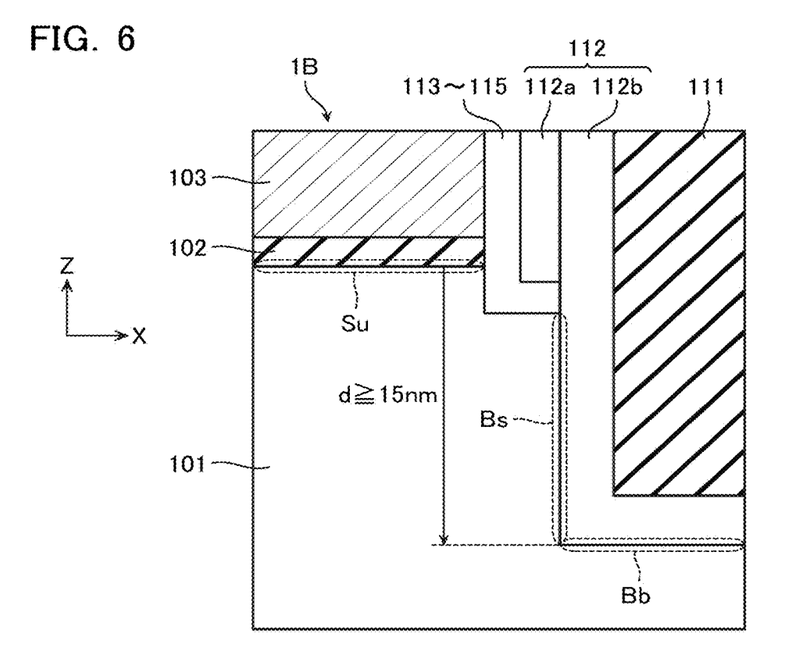
FIG. 6 is a schematic sectional view around a connection portion between a semiconductor substrate and a columnar body in a memory cell array in a semiconductor memory device according to a second embodiment.

FIG. 6 is a schematic sectional view around the connection portion between the semiconductor substrate and the columnar body in the memory cell array in the semiconductor memory device according to the present embodiment.

The memory cell array 1B in the semiconductor memory device has the following point as one feature in addition to features of the memory cell array 1A. That is, the memory cell array 1B is formed to have the bottom surface of the semiconductor layer 112 in a position where a depth d from the top surface of the semiconductor substrate 101 in the Z direction satisfies the relation d≥15 nm. In other words, in the memory cell array 1B, the second interface Bs is caused to exist as far as a position where the depth d≥15 nm in the Z direction.

Effects brought about by the memory cell array 1B in the present embodiment will now be described.

Figure 7:
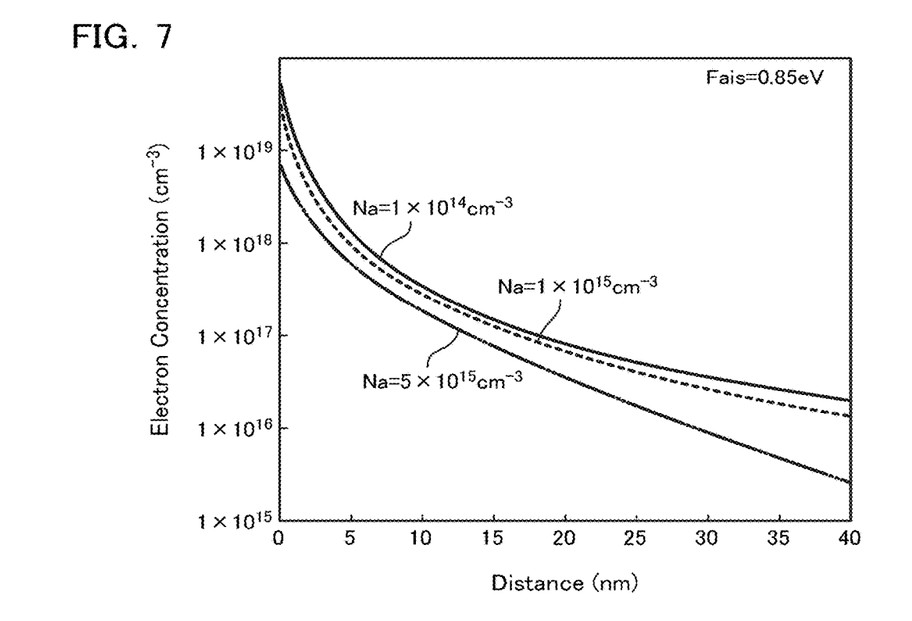
FIG. 7 is a graph illustrating relations between a depth from a top surface of the semiconductor substrate and an electron concentration in the semiconductor memory device.

FIG. 7 is a graph illustrating relations between the depth from the top surface of the semiconductor substrate and an electron concentration in the semiconductor memory device according to the present embodiment.

A concentration of impurities doped to the semiconductor substrate 101 is set to be Na=$1 \times 10^{15}$ cm$^{-3}$. If in this case band bending (for example, 0.7 eV) causing a strong inversion state occurs, the electron concentration on the surface of the semiconductor substrate 101 becomes approximately $1.0 \times 10^{17}$ cm$^{-3}$. An ordinary transistor is supposed. In a case where band bending in an on-state Fais=0.85 eV, the electron concentration becomes $1.0 \times 10^{17}$ cm$^{-3}$ as far as a depth of approximately 15 nm from the top surface Su of the semiconductor substrate 101.

In the memory cell array 1B in the present embodiment, the second interface Bs exists as far as the position of depth d≥15 nm. Therefore, it is possible to cover electrons spread in a deep portion of the semiconductor substrate 101 mostly. As a result, the memory cell array 1B can take in electrons required to turn on a transistor such as the memory cell MC from the semiconductor substrate 101 into the semiconductor layer 112 more certainly. In other words, according to the present embodiment, it is possible to obtain the effect of stabilization of the memory operation according to the first embodiment more certainly.

Note that, the present embodiment can be applied to the first embodiment and second to fifth embodiments described hereafter.

Third Embodiment

First, a structure of a memory cell array 1C in the semiconductor memory device according to a third embodiment will now be described.

Figure 8:
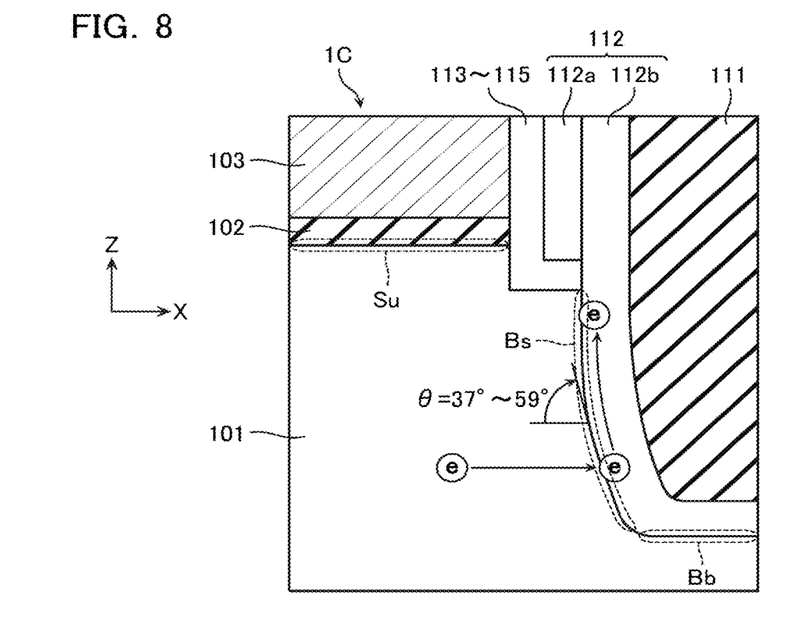
FIG. 8 is a schematic sectional view around a connection portion between a semiconductor substrate and a columnar body in a memory cell array in a semiconductor memory device according to a third embodiment.

FIG. 8 is a schematic sectional view around the connection portion between the semiconductor substrate and the columnar body in the memory cell array in the semiconductor memory device according to the present embodiment.

The memory cell array 1C in the semiconductor memory device has the features of the memory cell array 1A. In addition, a bottom portion of the semiconductor layer 112 is formed in a taper form in which a width in the X direction (or the Y direction) becomes small as the position approaches the bottom surface. The second interface Bs between the semiconductor substrate 101 and the semiconductor layer 112 is provided with an inclination (taper angle) of, for example, θ=37 to 59° in the X direction (or Y direction).

Effects brought about by the memory cell array 1C in the present embodiment will now be described.

Figure 9:
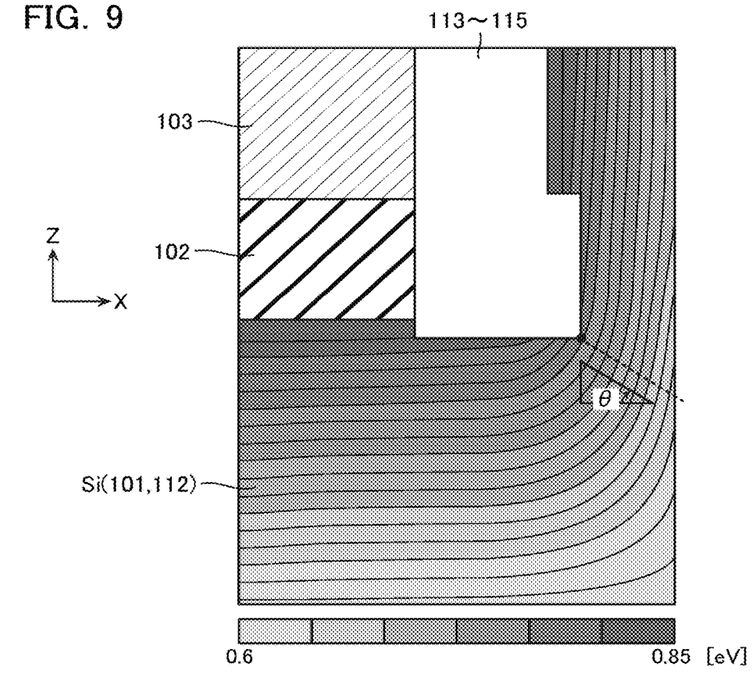
FIG. 9 is a diagram illustrating electric field distribution around the connection portion between the semiconductor substrate and the columnar body in the memory cell array in the semiconductor memory device.
Figure 10:
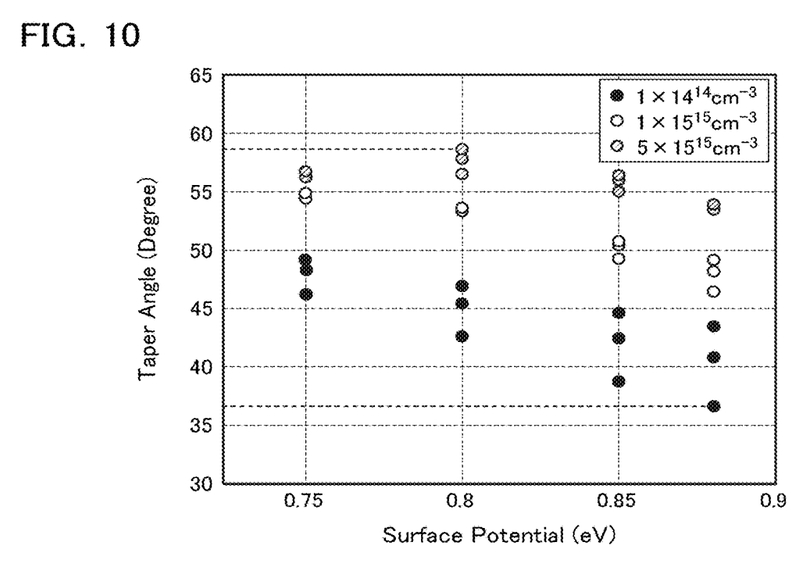
FIG. 10 is a graph illustrating relations between a surface potential of a semiconductor layer in the memory cell array and a direction of a strong electric field in the semiconductor memory device.

FIG. 9 is a diagram illustrating electric field distribution around the connection portion between the semiconductor substrate and the columnar body in the memory cell array in the semiconductor memory device according to the present embodiment. FIG. 10 is a graph illustrating relations between a surface potential of the semiconductor layer in the memory cell array and a direction of a strong electric field in the semiconductor memory device.

In general, in polysilicon, the crystal grain boundary is apt to become a current path. Since it can be considered that the interface between the semiconductor substrate 101 and the semiconductor layer 112 is a large crystal grain boundary, it can be said that the interface is apt to become a current path. In the present embodiment, therefore, it is possible to cause electrons that have flowed from the semiconductor substrate 101 into the second semiconductor film 112b to move to the first semiconductor film 112a side efficiently by aligning the second interface Bs with the strong electric field direction. According to data illustrated in FIGS. 9 and 10, the direction in which the electric field becomes the strongest is in the range of 37 to 59° with respect to the X direction (or the Y direction) in the case of the structure of the memory cell array 10.

According to the present embodiment, therefore, effects similar to those in the first embodiment can be obtained. In addition, it is also possible to cause electrons in the semiconductor substrate 101 to move into the semiconductor layer 112 efficiently by providing the second interface Bs with a predetermined inclination.

Note that, the present embodiment can be applied to the first and second embodiments, and fourth and fifth embodiments described hereafter.

Fourth Embodiment

First, a structure of a memory cell array 1D in a semiconductor memory device according to a fourth embodiment will now be described.

Figure 11:
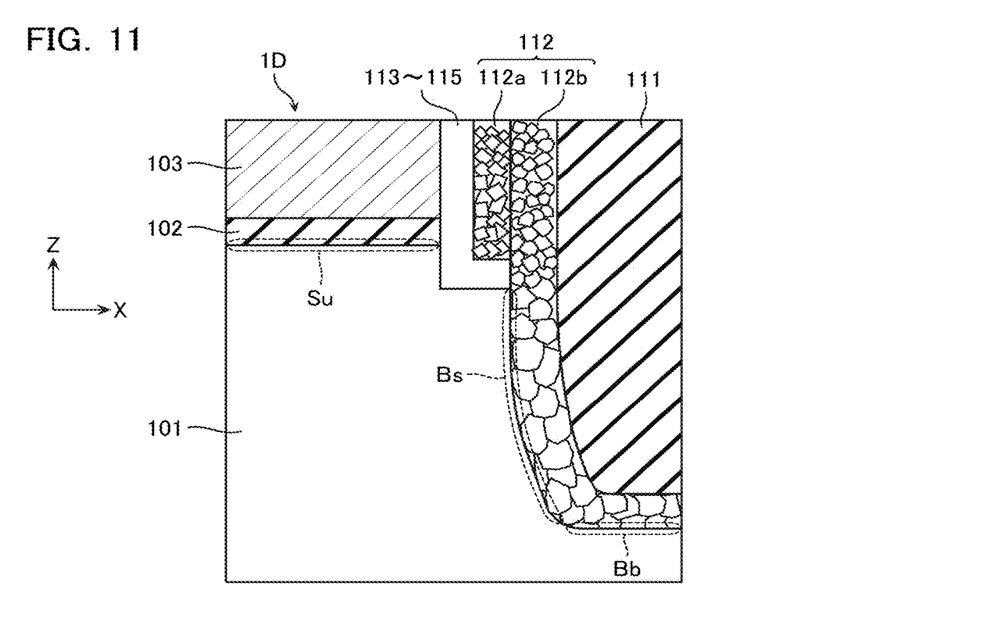
FIG. 11 is a schematic sectional view around a connection portion between a semiconductor substrate and a columnar body in a memory cell array in a semiconductor memory device according to a fourth embodiment.

FIG. 11 is a schematic sectional view around the connection portion between the semiconductor substrate and the columnar body in the memory cell array in a semiconductor memory device according to the present embodiment.

The memory cell array 1D in the semiconductor memory device has the following point as one feature in addition to features of the memory cell array 1A. That is, an average crystal grain diameter in a bottom portion of the semiconductor layer 112 is greater than an average crystal grain diameter in other portions of the semiconductor layer 112.

A manufacture method of the memory cell array 1D in the present embodiment will now be described.

Figure 12:
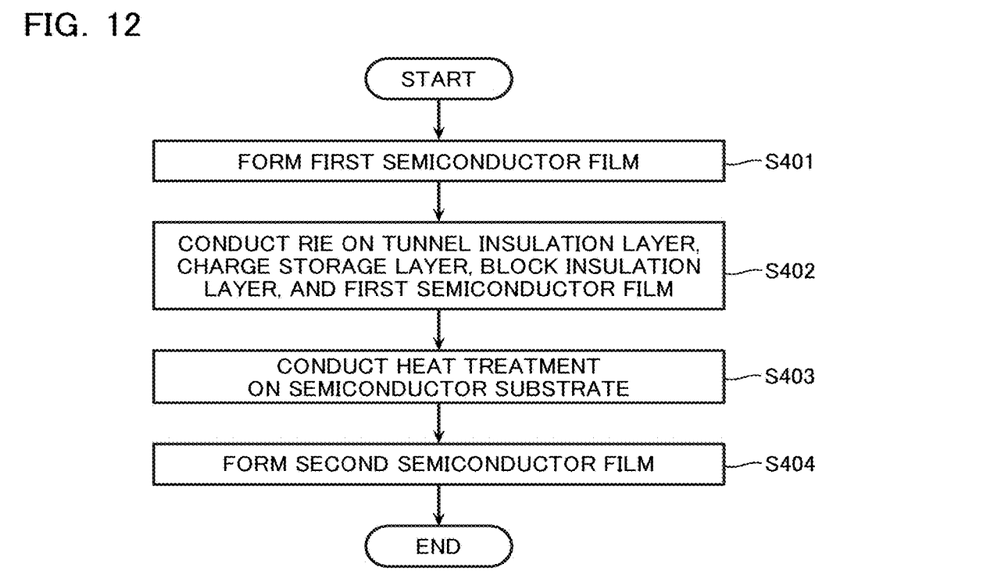
FIG. 12 is a flow chart of a portion of a manufacture process of the columnar body in the memory cell array in the semiconductor memory device.

FIG. 12 is a flow chart of a portion of a manufacture process of the columnar body in the memory cell array in the semiconductor memory device according to the present embodiment.

First, a memory hole is formed to bury the columnar body 105 therein. Films are formed on a side surface of the memory hole in an order of the block insulation layer 115, the charge storage layer 114, and the tunnel insulation layer 113. Subsequently, in step S401, the first semiconductor film 112a is formed on a side surface of the tunnel insulation layer 113.

Subsequently, in step S402, reactive ion etching (RIE) is conducted on the block insulation layer 115, the charge storage layer 114, the tunnel insulation layer 113, and the first semiconductor film 112a.

Subsequently, in step S403, heat treatment (anneal) is conducted on the semiconductor substrate 101. As a result, crystallinity of silicon, which is the material of the semiconductor substrate 101, is recovered.

Finally, in step S404, the second semiconductor film 112b is formed on side surfaces of the semiconductor substrate 101, the block insulation layer 115, the charge storage layer 114, the tunnel insulation layer 113, and the first semiconductor film 112a. At this time, an average crystal grain diameter in the vicinity of the boundary Bs to the semiconductor substrate 101 in the second semiconductor film 112b is apt to become large, because the crystallinity of silicon in the semiconductor substrate 101 is recovered in step S403. As a result, the average crystal grain diameter in the bottom portion of the semiconductor layer 112 can be made larger than that in other portions.

Heretofore, a portion of the manufacture process of the columnar body in the present embodiment has been described.

Effects brought about by the memory cell array 1D in the present embodiment will now be described.

Figure 13:
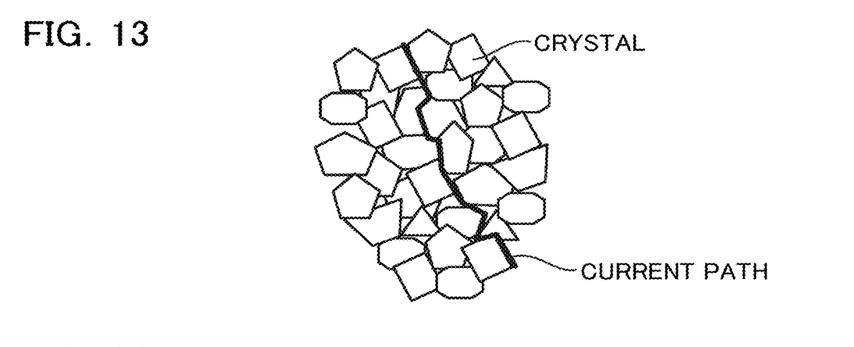
FIG. 13 is a diagram used to explain relations between an average crystal grain diameter in a semiconductor layer and a current path in the semiconductor memory device.
Figure 14:
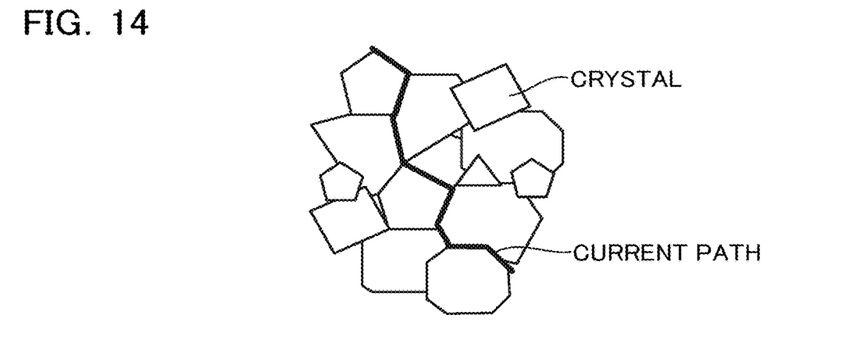
FIG. 14 is a diagram used to explain relations between an average crystal grain diameter in a semiconductor layer and a current path in the semiconductor memory device.

FIGS. 13 and 14 are diagrams used to explain relations between the average crystal grain diameter in the semiconductor layer and the current path in the memory cell array in the semiconductor memory device according to the present embodiment. FIG. 13 illustrates a case where the crystal grain diameter is small. FIG. 14 illustrates a case where the crystal grain diameter is large.

In general, if the crystal grain diameter of polysilicon is large, there is an advantage that stationary charges (scattering sources) are few because the crystal grain boundaries are few. On the other hand, there is a drawback that it is difficult to align the crystal grain boundaries functioning as a current path with a strong field direction.

In the case of the present embodiment, the interface Bs becomes the main current path in the bottom portion of the semiconductor layer 112 near the interface Bs as described in the third embodiment. Therefore, disadvantage caused by the drawback in the case where the crystal grain diameter is large is small. On the other hand, the stationary charge can be reduced by making the crystal grain boundary in the bottom portion of the semiconductor layer 112 large.

According to the present embodiment, therefore, effects similar to those in the first embodiment are obtained. In addition, it is also possible to cause electrons in the semiconductor substrate 101 to move into the semiconductor layer 112 efficiently, because stationary charges, which become scattering sources of electrons in the bottom portion of the semiconductor layer 112, are reduced.

Note that, the present embodiment can be applied to the first to third embodiments, and a fifth embodiment described hereafter.

Fifth Embodiment

First, a structure of a memory cell array 1E in a semiconductor memory device according to a fifth embodiment will now be described.

Figure 15:
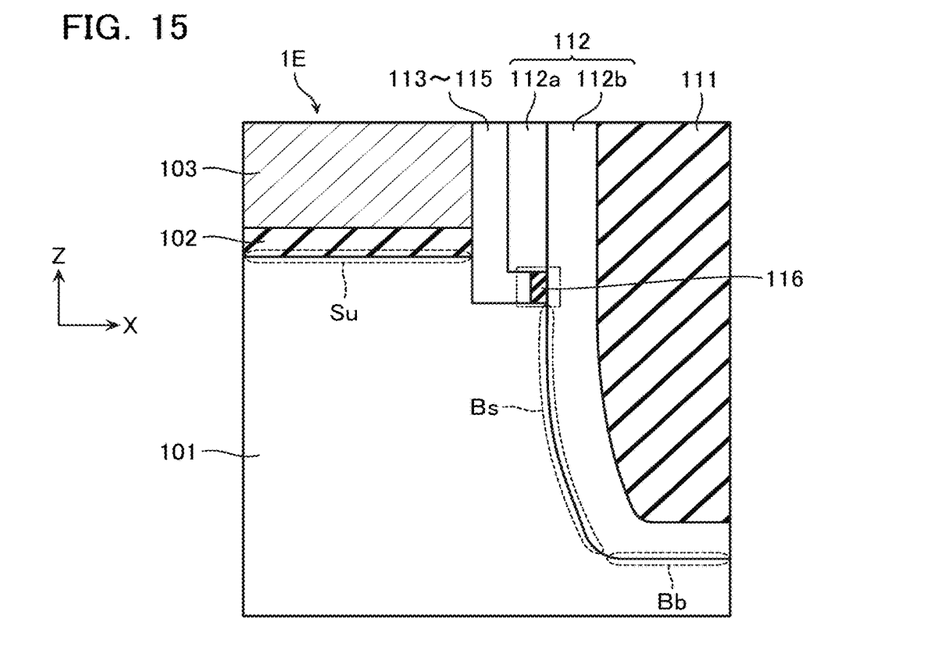
FIG. 15 is a schematic sectional view around a connection portion between a semiconductor substrate and a columnar body in a memory cell array in a semiconductor memory device according to a fifth embodiment.
Figure 16:
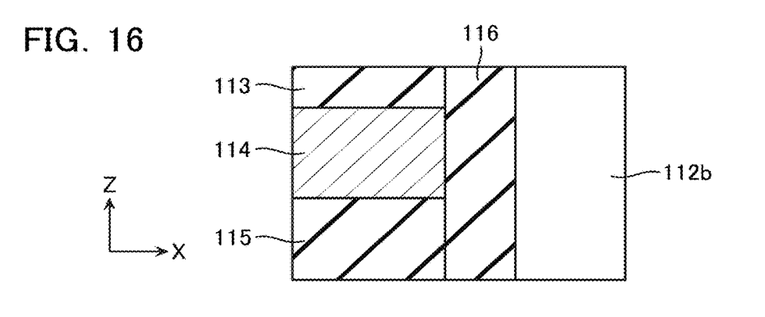
FIG. 16 is a schematic sectional view of the columnar body in the memory cell array in the semiconductor memory device.

FIG. 15 is a schematic sectional view around the connection portion between the semiconductor substrate and the columnar body in the memory cell array in the semiconductor memory device according to the present embodiment. Furthermore, FIG. 16 is a diagram obtained by enlarging a portion surrounded by a dot-dash line in FIG. 15.

The memory cell array 1E in the semiconductor memory device has the following point as one feature in addition to features of the memory cell array 1B. That is, the semiconductor layer 112 is electrically insulated from the charge storage layer 114 by disposing an insulation layer 116 between the second semiconductor film 112b and the block insulation layer 115, the charge storage layer 114, and the tunnel insulation layer 113.

A manufacture method of the memory cell array 1E in the present embodiment will now be described.

FIGS. 17 to 20 are schematic sectional views illustrating a manufacture process of the columnar body in the memory cell array in the semiconductor memory device according to the present embodiment.

Figure 17:
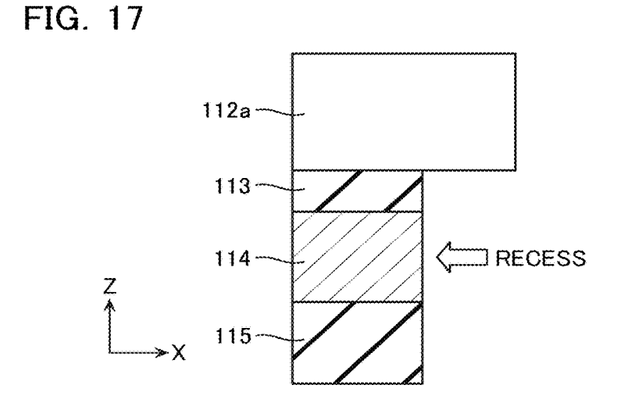
FIG. 17 is a schematic sectional view illustrating a manufacture process of the columnar body in the memory cell array in the semiconductor memory device.

First, a memory hole is formed to bury the columnar body 105 therein. Films are formed on a side surface of the memory hole in an order of the block insulation layer 115, the charge storage layer 114, and the tunnel insulation layer 113. Subsequently, the first semiconductor film 112a is formed on a side surface of the tunnel insulation layer 113. Subsequently, as illustrated in FIG. 17, the tunnel insulation layer 113, the charge storage layer 114, and the block insulation layer 115 are recessed by wet etching using diluted-hydrofluoric acid (DHF), and side surfaces of them are caused to retreat.

Figure 18:
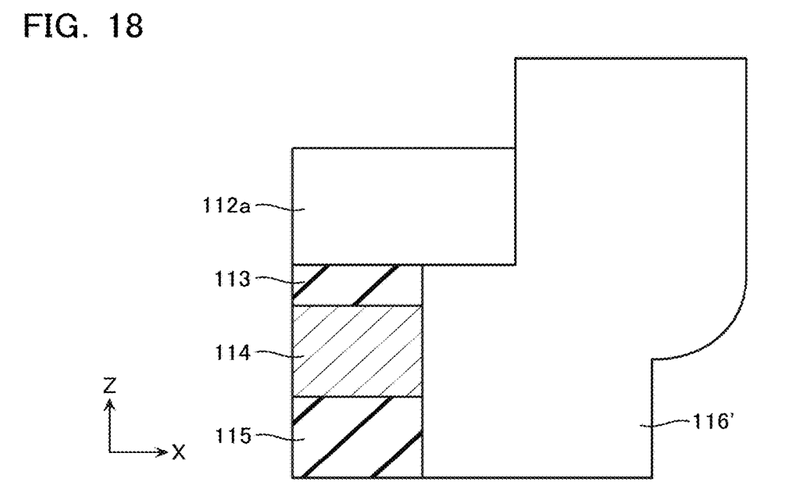
FIG. 18 is a schematic sectional view illustrating a manufacture process of the columnar body in the memory cell array in the semiconductor memory device.

Subsequently, as illustrated in FIG. 18, a silicon oxide film 116', which becomes the insulation layer 116, is formed on a bottom surface and a side surface of the first semiconductor film 112a, and side surfaces of the tunnel insulation layer 113, the charge storage layer 114, and the block insulation layer 115.

Figure 19:
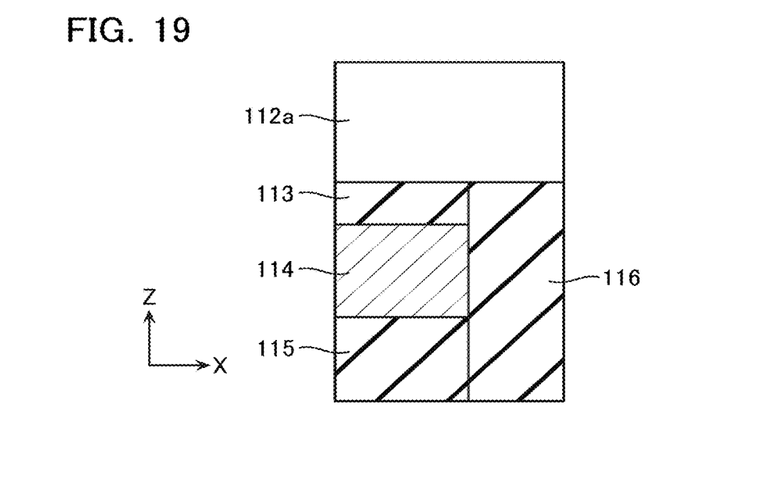
FIG. 19 is a schematic sectional view illustrating a manufacture process of the columnar body in the memory cell array in the semiconductor memory device.

Subsequently, as illustrated in FIG. 19, the silicon oxide film 116' is removed by anisotropic etching such as RIE to a degree that the side surface of the first semiconductor film 112a is exposed. As a result, the insulation layer 116 is left only on side surfaces of the tunnel insulation layer 113, the charge storage layer 114, and the block insulation layer 115.

Figure 20:
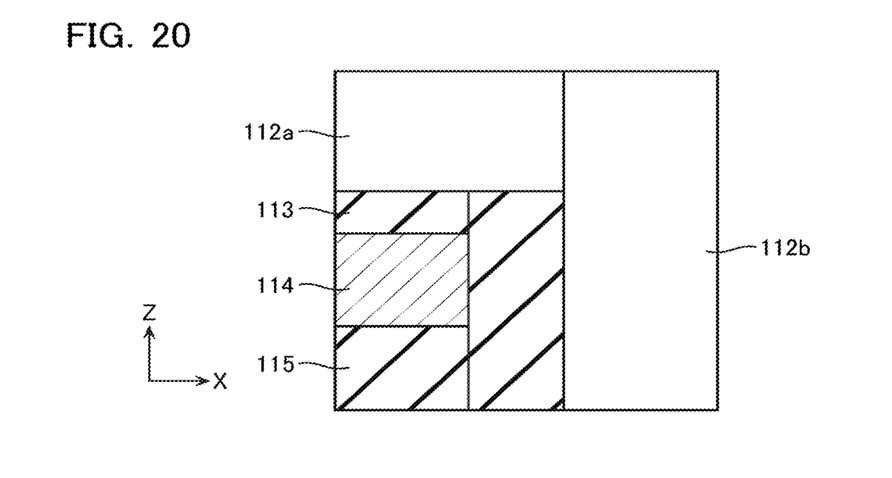
FIG. 20 is a schematic sectional view illustrating a manufacture process of the columnar body in the memory cell array in the semiconductor memory device.

Finally, as illustrated in FIG. 20, the second semiconductor film 112b is formed on side surfaces of the first semiconductor film 112a and the insulation layer 116.

Heretofore, a portion of the manufacture process of the columnar body in the present embodiment has been described.

Effects brought about by the memory cell array 1E in the present embodiment will now be described.

Figure 21:
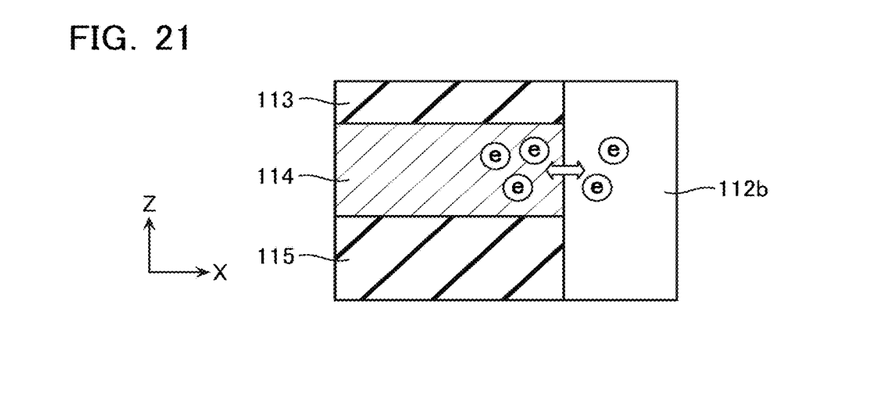
FIG. 21 is a schematic sectional view of a portion of a columnar body in a memory cell array in a semiconductor memory device according to a comparative example for the embodiment.

FIG. 21 is a schematic sectional view of a portion of the columnar body in the memory cell array in a semiconductor memory device according to a comparative example for the present embodiment.

In the case of the comparative example, the semiconductor layer 112 is in contact with the charge storage layer 114 unlike the memory cell array 1E.

As described above, electrons that have flown from the semiconductor substrate 101 move in the semiconductor layer 112. In the case where the semiconductor layer 112 is directly in contact with the charge storage layer 114 as in the comparative example, however, inflow and outflow of electrons are apt to occur between the semiconductor layer 112 and the charge storage layer 114. Such movement of electrons with respect to the charge storage layer 114 becomes a factor that hampers reliability of the memory operation.

In the case of the present embodiment, the insulation layer 116 insulates the semiconductor layer 112 from the charge storage layer 114. Therefore, inflow and outflow of electrons between the semiconductor layer 112 and the charge storage layer 114 can be suppressed. In other words, according to the present embodiment, not only effects similar to those in the first embodiment are obtained, but also reliability of the memory operation can be improved as compared with the case of the comparative example.

Note that, the present embodiment can be applied to the first to fourth embodiments.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, three directions intersecting each other being referred to as first to third directions, the semiconductor memory device comprising:
   a semiconductor substrate having a top surface spread in the first and second directions;
   a plurality of conductive layers laminated at predetermined intervals in the third direction on the semiconductor substrate; and
   a semiconductor layer having a columnar shape, and having an interface that is in contact with the semiconductor substrate on a side surface, the semiconductor layer being opposed to the plurality of conductive layers, the semiconductor layer having the third direction as a lengthwise direction,
   the interface existing in a position deeper than the top surface of the semiconductor substrate in the third direction,
   an average crystal grain diameter in a first portion of the semiconductor layer located near the interface being larger than that in other portions in the semiconductor layer.

2. The semiconductor memory device according to claim 1, comprising:
   a tunnel insulation layer and a charge storage layer disposed from the semiconductor layer to the conductive layers; and
   an insulation layer disposed in contact with the tunnel insulation layer and the charge storage layer and disposed between the semiconductor layer and the charge storage layer.

3. The semiconductor memory device according to claim 2, wherein the insulation layer is disposed in a place obtained by recessing end portions of the tunnel insulation layer and the charge storage layer.

4. The semiconductor memory device according to claim 1, wherein the semiconductor substrate includes a channel region where an impurity concentration is in a range of $5 \times 10^{15}$ cm$^{-3}$ to $1 \times 10^{14}$ cm$^{-3}$.

5. The semiconductor memory device according to claim 1, wherein
   the semiconductor layer includes a first semiconductor film and a second semiconductor film,
   the first semiconductor film is disposed to extend in the third direction and disposed between the second semiconductor film and the conductive layers, and
   the second semiconductor film is disposed to extend in the third direction and the second semiconductor film has the interface.

6. The semiconductor memory device according to claim 5, wherein
   the semiconductor layer includes the first portion of the second semiconductor film located near the interface, and
   an average crystal grain diameter in the first portion is greater than that in other portions in the first semiconductor film and the second semiconductor film.

* * * * *